US011809206B2

(12) United States Patent
Datta et al.

(10) Patent No.: US 11,809,206 B2
(45) Date of Patent: Nov. 7, 2023

(54) METHODS AND APPARATUS TO IMPLEMENT COMPENSATION CIRCUITRY IN AN ENVELOPE DETECTOR

(71) Applicant: Texas Instruments Incorporated, Dallas, TX (US)

(72) Inventors: Kishalay Datta, Kolkata (IN); Anant Shankar Kamath, Bangalore (IN); Kumar Anurag Shrivastava, Bangalore (IN); Swaminathan Sankaran, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/446,132

(22) Filed: Aug. 26, 2021

(65) Prior Publication Data

US 2023/0069663 A1    Mar. 2, 2023

(51) Int. Cl.
*G05F 1/46* (2006.01)
*G05F 1/56* (2006.01)
*H03F 1/02* (2006.01)
*H04B 1/16* (2006.01)

(52) U.S. Cl.
CPC ............ *G05F 1/56* (2013.01); *H03F 1/0216* (2013.01); *H04B 1/16* (2013.01); *H03F 2200/102* (2013.01); *H03F 2200/165* (2013.01)

(58) Field of Classification Search
CPC ... G05F 1/10; G05F 1/46; G05F 1/468; G05F 1/56; G05F 1/563; G05F 3/02; G05F 3/08; G05F 3/242; G05F 3/26; G05F 3/262; H03F 1/0216; H03F 2200/102; H04B 1/16; H04B 1/163; H04B 1/1638; H04B 2001/305
See application file for complete search history.

(56) References Cited

U.S. PATENT DOCUMENTS

| | | | |
|---|---|---|---|
| 4,467,286 A | 8/1984 | Stitt | |
| 5,969,658 A | 10/1999 | Naylor | |
| 8,618,971 B1 | 12/2013 | Li | |
| 2007/0285153 A1* | 12/2007 | Hasegawa | ........ H03K 19/00361 327/543 |
| 2021/0286395 A1* | 9/2021 | Downey | ................. G05F 3/222 |

* cited by examiner

*Primary Examiner* — Long Nguyen
(74) *Attorney, Agent, or Firm* — Valerie M. Davis; Frank D. Cimino (57) ABSTRACT

An example apparatus includes: a compensation circuit including: a current compensation output, a first transistor with a first current terminal and a first control terminal, the first current terminal coupled to the current compensation output, and a resistor ladder with a tap terminal coupled to the first control terminal, a current mirror circuit having a mirror input and a mirror output, the mirror input coupled to the current compensation output, and a rectification circuit having an input coupled to the mirror output.

9 Claims, 6 Drawing Sheets

METHODS AND APPARATUS TO IMPLEMENT COMPENSATION CIRCUITRY IN AN ENVELOPE DETECTOR

TECHNICAL FIELD

This description relates generally to envelope detectors, and more particularly to methods and apparatus to implement compensation circuitry in an envelope detector.

BACKGROUND

Isolation barriers (e.g., galvanic isolators, capacitive isolators, inductive isolators, and optical isolators) are commonly used to isolate digital signals from noisy environments (such as a switching circuit, etc.) and isolate circuits operating at one voltage from circuits operating at a higher voltage. To transfer digital signals across an isolation barrier, the digital signals are commonly converted into carrier signals that traverse the isolation barrier. After traversing the isolation barrier, the carrier signals need to be converted back into digital signals to be utilized by the receiving circuit. As such, digital isolators (as used herein, "digital isolator" and "digital isolation circuitry" mean circuitry that includes an isolation barrier and circuitry to transmit and receive signals, such as data and/or instructions, across the isolation barrier) commonly include an envelope detector to convert the carrier signal back to a digital signal after the carrier signal traverses the isolation barrier. The envelope detector often creates variations in the duty cycle (e.g., duty cycle distortion, DCD) of the digital signal resulting from the carrier signal due to temperature or semiconductor process variations in the envelope detector.

SUMMARY

Methods and apparatus to implement a compensation circuit including: a current compensation output, a first transistor with a first current terminal and a first control terminal, the first current terminal coupled to the current compensation output, and a resistor ladder with a tap terminal coupled to the first control terminal. A current mirror circuit having a mirror input and a mirror output, the mirror input coupled to the current compensation output. A rectification circuit having an input coupled to the mirror output.

BRIEF DESCRIPTION OF THE DRAWINGS

The same reference numbers or other reference designators are used in the drawings to designate the same or similar (functionally and/or structurally) features.

DETAILED DESCRIPTION

The drawings are not necessarily to scale. Generally, the same reference numbers in the drawing(s) and this description refer to the same or like parts. Although the drawings show layers and regions with clean lines and boundaries, some or all of these lines and/or boundaries may be idealized. In reality, the boundaries and/or lines may be unobservable, blended and/or irregular.

Envelope detectors are utilized by a number of applications, including digital isolator circuitry. A digital isolator may be used to transmit information over isolation barriers by converting a digital input signal to a carrier signal (e.g. modulating a carrier frequency with data) before transmission. Once the carrier signal has traversed the isolation barrier, the digital isolator uses an envelope detector circuit to convert the modulated carrier signal (modulated signal, e.g., using OOK modulation techniques) into a digital output signal.

The digital output signal may exhibit variations (such as jitter, duty cycle distortion, etc.) compared to the digital input signal. The variations may be caused by the speed of the carrier wave and temperature effects on components. For example, the jitter on the digital output signal may be the result of a noisy transmission of the carrier signal across the isolation barrier. Another source of jitter on the digital output signal may be process errors added to the rectified signal by the rectification and output circuits.

Duty cycle distortion exhibited in the digital output signal may also be the result of output stage tracking issues of the rectified input signal caused by process and temperature effects on the output stage and rectifier circuit components. As the frequency of the carrier signal increases, the more likely the digital output signal will exhibit jitter and duty cycle distortion. The jitter and duty cycle distortion may be a result of the rectifier circuit components causing increased electromagnetic interference (EMI), caused by an increase in transistor operation speeds in the rectification circuit. The duty cycle distortion exhibited by the digital output signal may result in a signal processing circuit incorrectly sampling the digital output signal.

The digital isolator examples described herein include example envelope detector circuits with compensation circuitry, such as process and temperature tracking circuitry. In some described examples, a compensation circuit may generate a compensation current based on a carrier signal that is received by the envelope detector circuitry. Such compensation current may also represent variations (such as process or temperature effects on components) that are added to a rectified signal by a rectification circuit and an output stage circuit while the rectification circuit is receiving the carrier signal as an input. In some described examples, the compensation current generated by the compensation circuit may be an input to a current mirror circuit. The current mirror circuit may generate a current that tracks the compensation current. The compensation circuit supplies current to a replication circuit and an output stage circuit. Advantageously, in response to the current mirror supplying a current (that is a proportional replica of the compensation current) to the rectification circuit and the output stage circuit, the output stage circuit may generate a digital output signal that exhibits reduced effects of variations that may generate duty cycle distortion or increased jitter.

Figure 1:
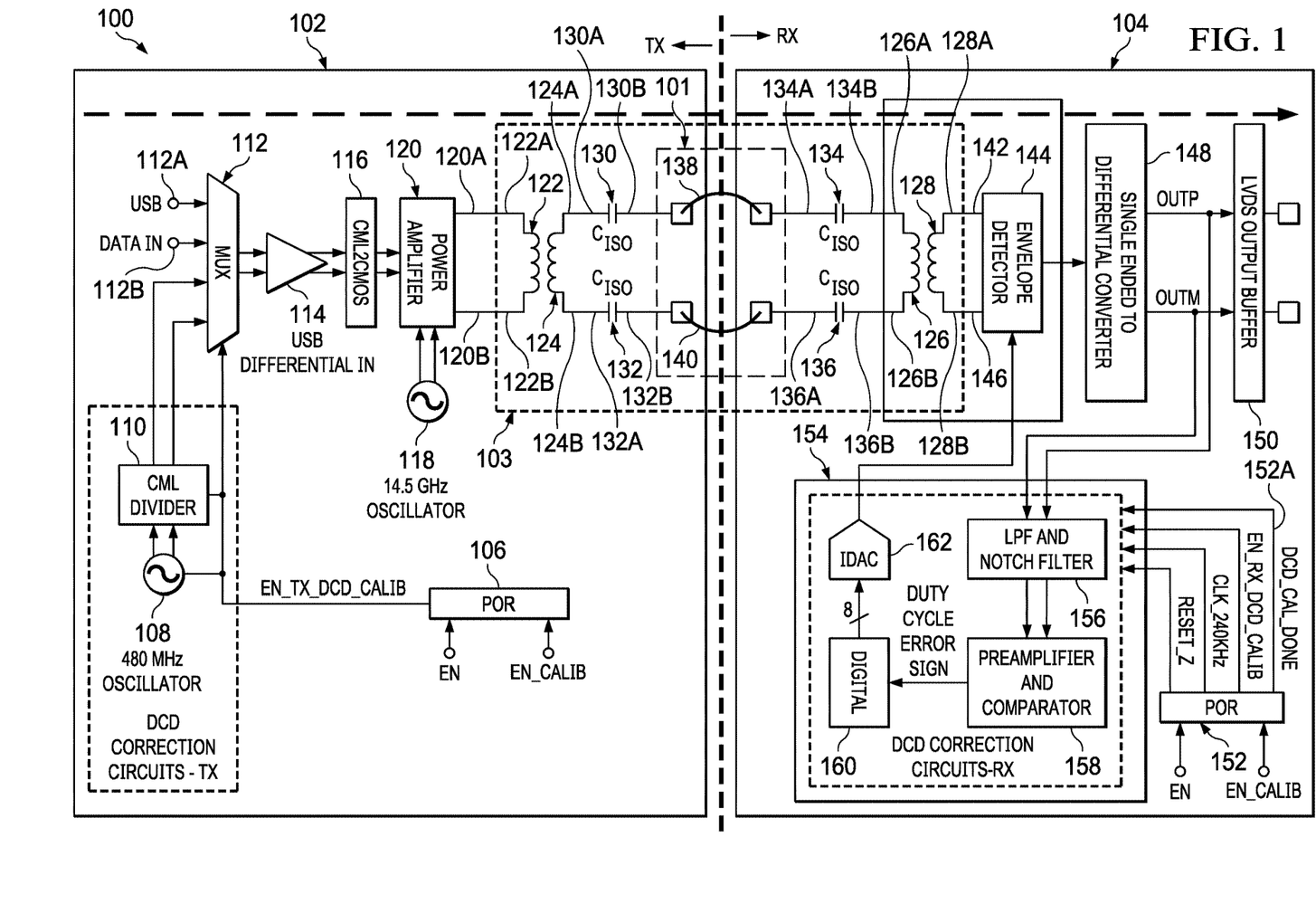
FIG. 1 is a block diagram of an example digital isolator circuitry including compensation circuitry.

FIG. 1 is a block diagram of an example digital isolator circuit 100 operable to transmit a signal across an isolation barrier 101 and receive the signal on the other side. In the example of FIG. 1, the digital isolator circuit 100 includes an example transmission circuit 102, an example isolation circuit 103, and an example receive circuit 104. The transmission circuit 102 may be configured to convert a digital signal into a OOK modulated carrier signal. The receive circuit 104 may be configured to receive the OOK modulated carrier signal (including, for example, a digital input signal modulated using OOK modulation on a carrier frequency signal) and demodulate the OOK modulated carrier signal to obtain the digital output signal.

In the example of FIG. 1, the transmission circuit 102 includes a first example power on reset (POR) circuit 106, a first example oscillator 108, an example current mode logic (CML) divider 110, an example multiplexer (MUX) 112, an example universal serial bus (USB) differential input buffer 114, an example current mode logic to complementary metal-oxide-semiconductor (CML2CMOS) converter 116, a second example oscillator 118, and an example power amplifier 120.

In some examples, the digital isolator circuit 100 is a single integrated circuit (IC) (such as circuitry implemented on a single semiconductor die or on multiple die but within a single IC package). For example, the transmission circuit 102 and the isolation circuit 103 may be included on the same semiconductor die. In some examples, the digital isolator circuit 100 may be implemented by two or more ICs in a single IC package to implement a multi-chip module (MCM). In some examples, the digital isolator circuit 100 may be implemented by two or more ICs (such as two or more IC packages). For example, the transmission circuit 102 and the isolation circuit 103 may be on a first die and the receive circuit 104 may be on a second die. In some examples, the transmission circuit 102 may be on a first die, the isolation circuit 103 may be on a second die, and the receive circuit 104 may be on a third die. Alternatively, one or more hardware circuit components (such as the POR circuit 106, the first oscillator 108, etc.) of the transmission circuit 102 may be included in the isolation circuit 103. Alternatively, one or more hardware circuit components (such as the first MUX 112, the CML divider 110, etc.) of the transmission circuit 102 may be included in the receive circuit 104.

The output of the first POR circuit 106 is coupled to the first oscillator 108, the current mode logic divider 110, and the multiplexer 112. The first POR circuit 106 may be configured to implement calibration operations to adjust for deviations in the manufacturing of components. The first POR circuit 106 uses calibration values determined during manufacturing to determine the initial state of the first oscillator 108, the current mode logic divider 110, and the multiplexer 112. In alternative example embodiments, the calibration values may be provided to the POR circuit 106 after manufacturing of the semiconductor devices (such as during subsequent device testing or provided by an end user after implementation of the device in a system).

The first oscillator 108 is configured to have a differential signal output (e.g., two complementary signals having phases differing by 180 degrees) coupled to the CIVIL divider 110. The multiplexer 112 may be coupled to the differential output of the CIVIL divider 110. The multiplexer 112 may be connected to a universal serial bus (USB) at input terminal 112A and to receive data at input terminal 112B. A differential MUX output of the multiplexer 112 may be coupled to the USB differential input buffer 114. The USB differential input buffer 114 includes a differential output coupled to the input of the CML2CMOS converter 116. The differential output of the CML2CMOS converter 116 is coupled to the input of the power amplifier 120. The differential output of the second oscillator 118 is coupled to the power amplifier 120.

In the example of FIG. 1, the isolation circuit 103 includes a first example inductor 122, a second example inductor 124, a third example inductor 126, a fourth example inductor 128, a first example capacitor 130, a second example capacitor 132, a third example capacitor 134, and a fourth example capacitor 136. In an alternative embodiment, inductors 122 and 124 may operate similar to a transformer and/or inductors 126 and 128 may operate similar to a transformer whereby energy through one inductor induces a proportional energy in the other inductor.

A first output terminal 120A of the power amplifier 120 is coupled to a first terminal 122A of the first inductor 122. A second output terminal 120B of the power amplifier 120 is coupled to a second terminal 122B of the first inductor 122. The first inductor 122 is coupled to the second inductor 124. A first terminal 124A of the second inductor 124 is coupled to a first terminal 130A of the first capacitor 130. A second terminal 124B of the second inductor 124 is coupled to a first terminal 132A of the second capacitor 132. A first terminal 134A of the third capacitor 134 is coupled (e.g., by a bond wire 138 or other type of conductor, such as a metal wiring in a semiconductor device or by a metal trace on a printed circuit board, PCB) to a second terminal 130B of the first capacitor 130. A first terminal 136A of the fourth capacitor 136 is coupled (e.g., by a bond wire 140 or other type of conductor, such as a metal wiring in a semiconductor device or by a metal trace on a printed circuit board, PCB) to a second terminal 132B of the second capacitor 132. A first terminal 126A of the third inductor 126 is coupled to a second terminal 134B of the third capacitor 134. A second terminal 126B of the third inductor 126 is coupled to a second terminal 136B of the fourth capacitor 136. The third inductor 126 is coupled to the fourth inductor 128. A first terminal 128A of the fourth inductor 128 is coupled to the first input 142 of an example envelope detector with compensation circuitry 144. A second terminal 128B of the fourth inductor 128 is coupled to a second input 146 of the envelope detector with compensation circuitry 144.

In the example of FIG. 1, the receive circuit 104 includes an example envelope detector with compensation circuitry 144, an example single ended to differential converter 148, an example low voltage differential signaling (LVDS) buffer 150, a second POR circuit 152, and a receive duty cycle distortion correction circuit 154. The receive circuit 104 includes a receive input that is coupled to the example envelope detector with compensation circuitry 144.

An output of the envelope detector with compensation circuitry 144 is coupled to a converter input of the single ended to differential converter 148. A first converter output of the differential output of the single ended to differential converter 148 is coupled to a first input of the low voltage differential signaling buffer 150. A second converter output of the differential output of the single ended to differential converter 148 is coupled to a second input of the low voltage differential signaling buffer 150. The first output of the single ended to differential converter 148 is coupled to a first correction input of the receive duty cycle distortion correction circuit 154. The second output of the single ended to differential converter 148 is coupled to a second correction input of the receive duty cycle distortion correction circuit 154.

In the example of FIG. 1, the receive duty cycle distortion correction circuit 154 includes an example input filter 156, an example preamplifier comparator 158, an example digital circuit 160, and an example current digital to analog converter (IDAC) 162. The input filter 156 may include an example low pass filter and/or an example notch filter. The preamplifier comparator 158 may include a preamplifier and/or a comparator. The receive duty cycle distortion correction circuit 154 is coupled to a calibration terminal 152A of the output of the second power on reset circuit 152 to receive signal DCD_CAL_DONE.

The first input (e.g., OUTP) of the receive duty cycle distortion correction circuit 154 is coupled to a first differential input of the input filter 156. The second input (e.g., OUTM) of the receive duty cycle distortion correction circuit 154 is coupled to a second differential input of the input filter 156. The differential output of input filter 156 is coupled to the preamplifier comparator 158. The error sign output of the preamplifier comparator 158 is coupled to the digital circuit 160. The output of the digital circuit 160 is coupled to an input of the IDAC 162. An output of the IDAC 162 (e.g., the output is an analog current that is based on the digital input to IDAC 162) is coupled to the envelope detector with compensation circuitry 144.

In example operation, the transmission circuit 102 may be coupled to a digital input signal via the USB input 112A and/or the data input 112B. The transmission circuit 102 converts the digital input signal to an OOK modulated carrier signal so that transmission circuit 102 can transmit the OOK modulated carrier signal across isolation barrier 101 to the receiver input of the receiver circuit 104. The isolation barrier 101 may be implemented by isolation circuit 103. Specifically, isolation may be provided by first capacitor 130 and the second capacitor 132 (on the transmission side of isolation barrier 101) and the third capacitor 134 and fourth capacitor 136 (on the receive side of the isolation barrier 101).

In example operation, the envelope detector with compensation circuitry 144 converts the OOK modulated carrier signal to a digital output signal similar to (preferably, identical to) the digital input signal. The single ended to differential converter 148 converts the digital output signal to a differential digital output signal (OUTP and OUTM). The receive duty cycle distortion correction circuit 154 may be configured to convert the differential digital output signal into an adjustment current input for the envelope detector with compensation circuitry 144. The envelope detector with compensation circuitry 144 converts the adjustment current to further minimize the duty cycle distortion of the digital output signal. Advantageously, the receive duty cycle distortion correction circuit 154 allows the envelope detector with compensation circuitry 144 to further minimize the duty cycle distortion of the digital output signal.

Figure 2:
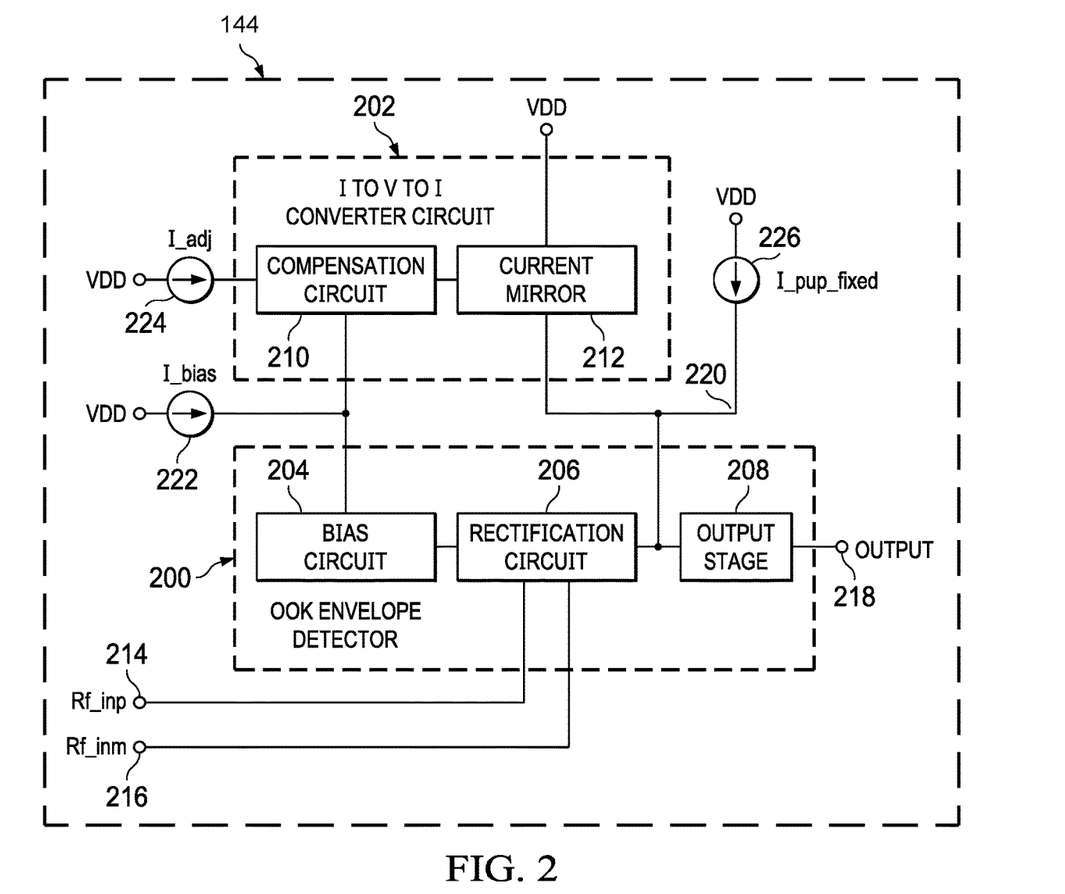
FIG. 2 is a block diagram of an example envelope detector circuit of FIG. 1 including an example on-off keying (OOK) envelope detector and an example current-to-voltage-to-current converter circuit to track and adjust for process and temperature variations.

FIG. 2 is a block diagram of an example implementation of an envelope detector with compensation circuitry 144 of FIG. 1. The example of FIG. 2 includes an example on-off keying (OOK) envelope detector 200 and an example current-to-voltage-to-current (I-V-I) converter circuit 202 to track and adjust for process and temperature variations. In the example of FIG. 2, the OOK envelope detector 200 includes an example bias circuit 204, an example rectification circuit 206, and an example output stage 208. The example I-V-I converter circuit 202 includes an example compensation circuit 210 and an example current mirror 212. The digital isolator circuit 100 of FIG. 1 includes an example OOK modulated carrier signal input (Rf_inp) 214 and an inverted OOK modulated carrier signal input (Rf_inm) 216, such a carrier signal may be a signal crossing an isolation barrier (e.g. isolation barrier 101 of FIG. 1). The inverted OOK modulated carrier signal input 216 is an inverted replica of the modulated data represented by the OOK modulated carrier signal input 214. A current supply terminal 220 couples the OOK envelope detector 200 to the I-V-I converter circuit 202. An example digital output signal 218 may be coupled to an output buffer or a single ended to differential converter circuit 124 of FIG. 1. An example pull current source 226 may supply current (having a current magnitude of I_pup_fixed) to the OOK envelope detector 200 by the current supply terminal 220. An example bias current source 222 (supplying a current with a magnitude of I_bias) and an example adjustment current source 224 (supplying a current with a magnitude of I_adj) coupled to the compensation circuit 210, the bias current source 222 and adjustment current source 224 may be implemented using a feedback loop or a fixed value (such as the receive DCD correction circuit 154 of FIG. 1).

In operation, the OOK envelope detector 200 converts the OOK modulated carrier signal input 214 and the inverted OOK modulated carrier signal input 216 to the digital output signal 218. The rectification circuit receives the OOK modulated carrier signal input 214 and the inverted OOK modulated carrier signal input 216 (such as the envelope detector input of FIG. 1) and outputs a full wave rectification of the OOK modulated carrier signal input 214. The bias circuit 204 is configured to bias (using the bias current from bias current source 222) the output of the rectification circuit 206 (which is based on OOK modulated carrier signal input 214). The rectification circuit 206 is coupled to the output stage 208 through the current supply terminal 220. The pull current source 226 and the current mirror 212 supply current (via supply terminal 220) to the rectification circuit 206 and the output stage 208.

In this example, the I-V-I converter circuit 202 is configured to generate a non-linear conversion of the compensation current to counter variations (such as jitter and duty cycle distortion) present in the OOK envelope detector 200. In this example, the compensation circuit is configured to convert the current from the adjustment current source 224 and the bias current source 222 to the current compensation output. Such compensation current may be configured to exhibit variations similar to the variations exhibited in the OOK envelope detector 200. In this example, the adjustment current source 224 may be configured to change in response to the OOK modulated carrier signal input 214 and the inverted OOK modulated carrier signal input 216. The bias current source 222 may be configured to adjust the digital output signal 218, such that duty cycle distortion is minimized. The I-V-I converter circuit 202 is configured to isolate the generated compensation current from the OOK envelope detector 200. The current mirror 212 is configured to isolate the compensation current (provided by compensation circuit 210) from the OOK envelope detector 200. As such, the mirrored current (which is a proportion of the compensation current depending on the sizing of the transistors used in the current mirror 212) generated by the current mirror 212 is provided to the OOK envelope detector 200 (e.g. to both rectification circuit 206 and to output stage 208), such that the output stage 208 generates the digital output signal 218 based on the mirrored compensation current. The digital output signal 218, thereby, exhibits minimized jitter and duty cycle distortion.

In the illustrated example of FIG. 2, the compensation circuit 210 is coupled to the current mirror 212, the bias current source 222, and the adjustment current source 224. The current mirror 212 and the pull current source 226 are coupled to the rectification circuit 206 and output stage 208. The bias circuit 204 is coupled to the rectification circuit 206 and to the bias current source 222. The rectification circuit is also coupled to the OOK modulated carrier signal input 214 and the inverted OOK modulated carrier signal input 216. OOK modulated carrier signal input 214 and inverted OOK modulated carrier signal input 216 are directly or indirectly coupled to the output stage 208 so that the digital output signal 218 is a compensated version of the OOK modulated carrier signal input 214 and inverted OOK modulated carrier signal input 216.

In example operation, the rectification circuit 206 may generate a rectified signal from the OOK modulated carrier signal input 214 and the inverted OOK modulated carrier signal input 216. The compensation circuit 210 may generate the compensation current based on current from the adjustment current source 224 and the bias current source 222. The current mirror 212 may generate a mirrored current based on the compensation current from the compensation circuit 210. The output stage 208 may generate the digital output signal 218 from the rectified signal and the mirrored version of the compensation current. Advantageously, the digital output signal 218 described herein may exhibit minimized jitter and duty cycle distortion.

Figure 3:
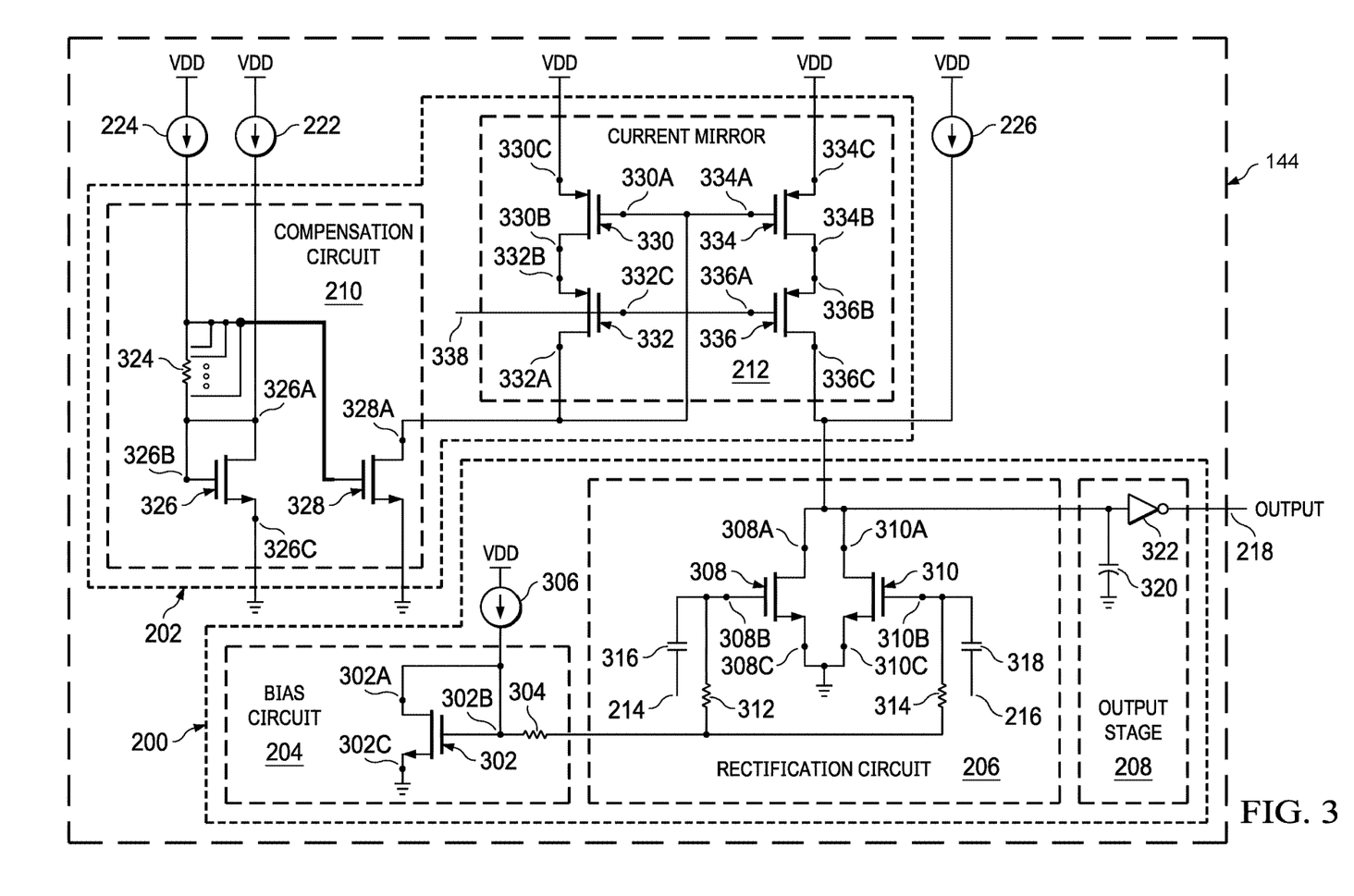
FIG. 3 is a schematic diagram of an example OOK envelope detector circuit of FIG. 2 including example compensation circuitry to track and adjust for process and temperature variation.

FIG. 3 is a schematic diagram of an example implementation of the envelope detector 144 of FIG. 2 including example compensation circuitry to track process and temperature variations. The example of FIG. 3 includes example circuits to implement the bias circuit 204, the rectification circuit 206, the output stage 208, the compensation circuit 210, and the current mirror circuit 212.

In the example of FIG. 3, the bias circuit 204 includes a first example transistor 302 and a first example resistor 304. Alternatively, the first transistor 302 may be implemented using a diode (e.g. with a reference voltage), an N-channel field-effect transistor (FET), an N-channel insulated-gate bipolar transistor (IGBT), an N-channel junction field effect transistor (JFET), an NPN bipolar junction transistor (BJT) and/or, with slight modifications, a p-type equivalent device. A gate terminal of a transistor may be referred to as a control terminal. A source terminal, a drain terminal, an emitter terminal, and/or collector terminal of a transistor may be referred to as a current terminal.

A first bias current source 306 is an input of the bias circuit that is coupled between voltage source VDD and a first current terminal 302A of the first transistor 302. The first current terminal 302A of the first transistor 302 is coupled to a control terminal 302B of the first transistor 302. The control terminal 302B of the first transistor 302 is coupled to the first resistor 304. A second current terminal 302C of the first transistor 302 is coupled to a common potential (e.g., ground).

In the example of FIG. 3, the rectification circuit 206 includes a second example transistor 308, a third example transistor 310, a second example resistor 312, a third example resistor 314, a fifth example capacitor 316, and a sixth example capacitor 318. The rectification circuit has an additional current source input 226. The second transistor 308 is an N-channel MOSFET. Alternatively, the second transistor 308 may be a N-channel FET, an N-channel IGBT, an N-channel JFET, an NPN BJT, a P-channel MOSFET, a P-channel FET, a P-channel IGBT, a P-channel JFET, and/or a PNP BJT. The third transistor 310 is an N-channel MOSFET. Alternatively, the third transistor 310 may be a N-channel FET, an N-channel IGBT, an N-channel JFET, an NPN BJT, a P-channel MOSFET, a P-channel FET, a P-channel IGBT, a P-channel JFET, and/or a PNP BJT.

A control terminal 308A of the second transistor 308 is coupled to a first current terminal 310A of the third transistor 310 and to current source 226. The second resistor 312 is coupled between the first resistor 304 and a control terminal 308B of the second transistor 308. The fifth capacitor 316 is coupled between the OOK modulated carrier signal input 214 and the control terminal 308B of the second transistor 308. The third resistor 314 is coupled between the first resistor 304 and a control terminal 310B of the third transistor 310. The sixth capacitor 318 is coupled between the inverted OOK modulated carrier signal input 216 and the control terminal 310B of the third transistor 310. A second current terminal 308C of the second transistor 308 is coupled to a second current terminal 310C of the third transistor 310.

In the example of FIG. 3, the output stage 208 includes the digital signal output 218, a seventh example capacitor 320, and an example amplifier 322. The amplifier 322 is a self-biased inverter. Alternatively, the amplifier 322 may be a transimpedance amplifier or an inverting buffer. The seventh capacitor 320 is coupled between the first current terminal 310A of the third transistor 310 and common potential (e.g., ground). The first current terminal 310A of the third transistor is coupled to the input of the amplifier 322. The digital output signal 218 is coupled to the output of the amplifier 322.

In the example of FIG. 3, the compensation circuit 210 includes a first example resistor ladder 324, a fourth example transistor 326, and a first example transistor array 328. The fourth transistor 326 is an N-channel metal-oxide-semiconductor field-effect transistor (MOSFET). Alternatively, the fourth transistor 326 may be implemented using a diode (e.g. with a reference voltage), N-channel FET, an N-channel IGBT, an N-channel JFET, an NPN BJT and/or, with slight modifications, a p-type equivalent device. The first transistor array 328 may be a N-channel FET, an N-channel IGBT, an N-channel JFET, an NPN BJT and/or, with slight modifications, a p-type equivalent device. The first resistor ladder 324 is a resistor circuit configured to represent the OOK modulated carrier signal in a plurality of voltage divisions that combine to generate a linear or sinusoidal representation. For example, the first resistor ladder 324 may be implemented by a plurality of coupled resistors. Examples of resistor ladders include resistor ladders shown in co-assigned U.S. Pat. Nos. 8,618,971, 5,969,658, 4,467,286 (each of which are incorporated by reference in their entirety). The first transistor array 328 includes a plurality of transistor gate terminals each coupled to the resistor ladder 324 at a tap terminal, such that each transistor gate terminal corresponds to a voltage division of the linear or sinusoidal representation of the OOK modulated carrier signal. The first transistor array 328 may include N-channel MOSFETs, such that each drain terminal is coupled to the remaining drain terminals and each source terminal is coupled to common potential (e.g., ground). Alternatively, the devices of the first transistor array 328 may be implemented by N number of N-channel FET, N-channel IGBT, N-channel JFET, NPN BJT, P-channel MOSFET, P-channel FET, P-channel IGBT, P-channel JFET, and/or PNP BJT.

The adjustment current source 224 is coupled between voltage source VDD and the input of the first resistor ladder 324. A first current terminal 326A of the fourth transistor 326 is coupled to a control terminal 326B of the fourth transistor 326. The bias current source 222 is coupled between voltage source VDD and the first current terminal 326A of the fourth transistor 326. A second current terminal 326C of the fourth transistor 326 is coupled to common potential (e.g., ground). The control terminal 326B of the fourth transistor 326 is coupled to the first output of the first resistor ladder 324. The first resistor ladder 324 includes a plurality of resistor branches and a plurality of tap terminals. The first transistor array 328 includes a plurality of branch transistor control terminals coupled to different tap terminals on different branches of the first resistor ladder 324. Each tap terminal coupled to a control terminal of a different transistor as part of the first transistor array 328. The first transistor array 328 includes a plurality of first current terminals coupled together and a plurality of second current terminals coupled to the common potential (e.g., ground).

In the example of FIG. 3, the current mirror 212 includes a fifth example transistor 330, a sixth example transistor 332, a seventh example transistor 334, and a eighth example transistor 336. The fifth transistor 330 is a P-Channel MOSFET. Alternatively, the fifth transistor 330 may be a P-channel FET, a P-channel IGBT, a P-channel JFET, a PNP BJT, a N-channel MOSFET, a N-channel FET, a N-channel IGBT, a N-channel JFET, and/or an NPN BJT. The sixth transistor 332 is a P-Channel MOSFET. Alternatively, the sixth transistor 332 may be a P-channel FET, a P-channel IGBT, a P-channel JFET, a PNP BJT, a N-channel MOSFET, a N-channel FET, a N-channel IGBT, a N-channel JFET, and/or an NPN BJT. The seventh transistor 334 is a P-Channel MOSFET. Alternatively, the seventh transistor 334 may be a P-channel FET, a P-channel IGBT, a P-channel JFET, a PNP BJT, a N-channel MOSFET, a N-channel FET, a N-channel IGBT, a N-channel JFET, and/or an NPN BJT. The eighth transistor 336 is a P-Channel MOSFET. Alternatively, the eighth transistor 336 may be a P-channel FET, a P-channel IGBT, a P-channel JFET, a PNP BJT, a N-channel MOSFET, a N-channel FET, a N-channel IGBT, a N-channel JFET, and/or an NPN BJT.

A first current terminal 328A of the first transistor array 328 in the compensation circuit 210 is coupled to a first current terminal 332A of the sixth transistor 332, a control terminal 330A of the fifth transistor 330 and a control terminal 334A of the seventh transistor 334. A first current terminal 330B of the fifth transistor 330 is coupled to a second current terminal 332B of the sixth transistor 332. A control terminal 332C of the sixth transistor 332 is coupled to a control terminal 336A of the eighth transistor 336 and to a cascode input 338. A first current terminal 334B of the seventh transistor 334 is coupled to a first current terminal 336B of the eighth transistor 336. The second current terminals 334C and 330C of transistors 334 and 330 are coupled to voltage source VDD. The second current terminal 336C of transistor 340 is coupled to rectification circuit 206 and current source 226 (also coupled to voltage source VDD). The first current terminal 308A of the second transistor 308 is coupled to current source 226, the first current terminal 310A of the third transistor 310, and the second current terminal 336C of the eighth transistor 336.

In the example of FIG. 3 the compensation circuit 210 is a N-type circuit, the current mirror circuit 212 is a P-type circuit, and the rectification circuit 206 is a N-type circuit, the type defined by the transistors. Alternatively, the compensation circuit 210 may be a P-type circuit, the current mirror circuit 212 may be a N-type circuit, and the rectification circuit 206 may be a P-type circuit. The compensation circuit 210 and the rectification circuit 206 in P-type configuration may be biased to the supply voltage potential level. The current mirror circuit 212, in N-type configuration, may be biased to ground potential.

In some examples, the envelope detector with temperature and process tracking 144 is a single integrated circuit (IC) (such as circuitry implemented on a single semiconductor die or on multiple die but within a single IC package). For example, the bias circuit 204 and the compensation circuit 210 may be included on the same semiconductor die. In some examples, the envelope detector with temperature and process tracking 144 may be implemented by two or more ICs in a single IC package to implement a multi-chip module (MCM). In some examples, the envelope detector with temperature and process tracking 144 may be implemented by two or more ICs (such as two or more IC packages). For example, the bias circuit 204 may be on a first die and the compensation circuit 210 may be on a second die. In some examples, the bias circuit 204 may be on a first die, the rectification circuit 206 may be on a second die, and the current mirror circuit 212 and the output stage 208 may be on a third die. Alternatively, one or more hardware circuit components (such as the second transistor 308, the third transistor 310, the fifth capacitor 316, the sixth capacitor 318, the second resistor 312, etc.) of the rectification circuit 206 may be included in the output stage 208. Alternatively, one or more hardware circuit components (such as the fourth transistor 326, the first transistor array 328, the first resistor ladder, etc.) of the compensation circuit 210 may be included in the current mirror circuit 212. Alternatively, one or more hardware circuit components (such as the first transistor 302, the first resistor 304, etc.) of the bias circuit 204 may be included in the rectification circuit 206.

In example operation, the fifth capacitor 316 receives the OOK modulated carrier signal input 214 to enable the second transistor 308 to generate a rectified signal. In some such examples, the bias current source 306 may enable the first transistor 302 to generate a bias voltage across the first resistor 304. The generated bias voltage across the first resistor 304 may additionally contribute to a bias across the second resistor 312 contributing to being able to enable the second transistor 308. The second transistor 308 may sink current from the mirrored current output of the eighth transistor 336 or the current source 226. In example operation, the sixth capacitor 318 receives the inverse OOK modulated carrier signal input 216 to enable the third transistor 310 to generate the rectified signal. In some such examples, the bias current source 306 may enable the first transistor 302 to generate a bias voltage across the first resistor 304. The generated bias voltage across the first resistor 304 may additionally contribute to a bias across the third resistor 314 contributing to enable the third transistor 310. The third transistor 310 may sink current from the mirrored current output of the eighth transistor 336 or the current source 226.

In example operation, the first resistor ladder 324 may be configured to couple a plurality of tap terminals to the gate terminals of the first transistor array 328. The tap terminals of the first resistor ladder 324 couple to the corresponding gate terminals of the first transistor array 328 based on a linear compensation configuration or a sinusoidal compensation configuration. The linear compensation configuration couples the transistors of the first transistor array 328 to the divisions of the first resistor ladder 324 that contribute to a linear compensation current. The sinusoidal compensation configuration couples the transistors of the first transistor array 328 to the divisions of the first resistor ladder 324 that contribute to generate sinusoidal compensation signal. The receive duty cycle distortion correction circuit 154 of FIG. 1 may determine the compensation configuration. The receive duty cycle distortion correction circuit 154 of FIG. 1 may configure the first adjustment current source 224, such that the first transistor array 328 may generate a section of the compensation current, referred to as N:1, based on the compensation configuration. The N:1 contribution to the compensation current may be a section of the sinusoidal or linear compensation current that may combine with the sections generated by the remaining transistors in the first transistor array 328. The combined sections of the compensation current generated at the coupled drains of the first transistor array 328 may generate a sinusoidal signal (such as the contributions of sections N:1-N:11). The N:1 contribution may be represented as a voltage at the tap terminal. The transistor coupled to the N:1 voltage at the tap terminal converts the voltage to a current representation. Advantageously, the non-linear transformation of a current entering the first resistor ladder 324 to a voltage at the tap terminal and back to a current at the first transistor array 328 enables a non-linear tracking of the OOK modulated carrier signal.

In example operation, the fourth transistor 326 generates a bias for the first resistor ladder 324, such that the bias generated is similar to (preferably, identical to) the bias generated by the first transistor 302. In some such examples, the contributions of the resistor branches of the first resistor ladder 324 is configured to generate a current flowing through the first transistor array 328, such that the current flowing through the coupled current terminal 328A of the first transistor array 328 is similar to (preferably, identical to) a scaled version of the average current flowing through the second transistor 308 and the third transistor 310.

In example operation, the fifth transistor 330 is enabled to source a current similar to a scaled version of the average sum of currents flowing through the second transistor 308 and the third transistor 310. The sixth transistor 332 may be configured to enable current from the fifth transistor 330 to flow, such that the current supplied to the first transistor array 328 is similar to the scaled version of the average sum of currents flowing through the second transistor 308 and the third transistor 310. In example operation, the seventh transistor 334 is enabled to source a current similar to a scaled version of the average sum of currents flowing through the second transistor 308 and the third transistor 310. The eighth transistor 336 may be configured to enable current from the seventh transistor 334 to flow, such that the current supplied to the rectification circuit 206 and the output stage 208 are the average sum of currents flowing through the second transistor 308 and the third transistor 310. Advantageously, the current supplied by the current mirror circuit 212 allows for the digital signal output 218 from the output stage 208 to exhibit minimized duty cycle distortion and jitter.

In example operation, the output stage 208 is configured to remove the carrier frequency amplitude changes from the output of the rectification circuit 206. The amplifier input of the amplifier 322 generates duty cycle distortion of the digital signal output 218 as a result of additional current supplied from the seventh capacitor 320. The seventh capacitor 320 discharges in response to temperature variation in the rectification circuit 206. The additional current from the seventh capacitor 320 discharge generates duty cycle distortion on the digital signal output 218. The generated compensation current is configured to supply current to reduce the magnitude of the seventh capacitor 320 discharge response to a temperature variation in the rectification circuit 206. Advantageously, the use of the compensation current to reduce the magnitude of the discharge of the seventh capacitor 320 results in reduced duty cycle distortion of the digital signal output 218.

Figure 4:
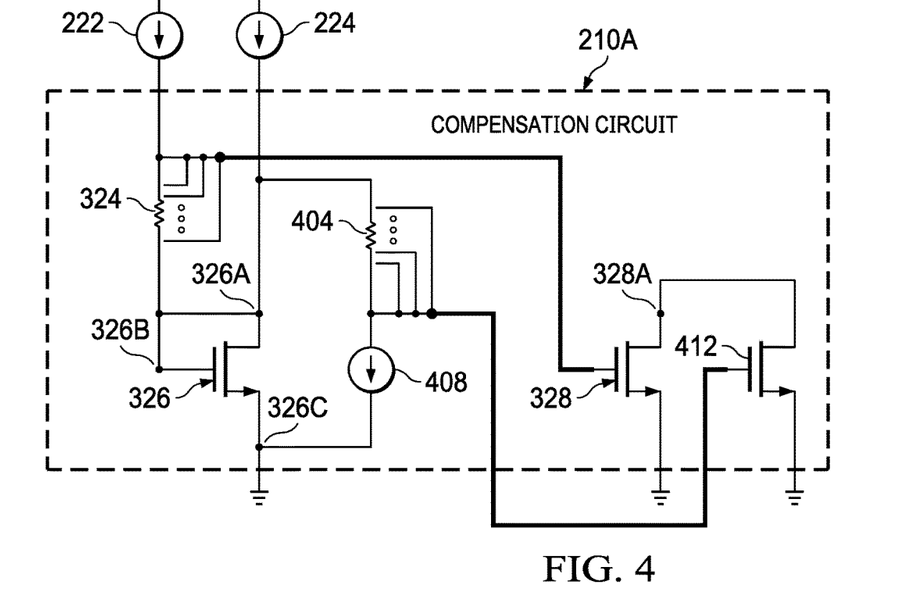
FIG. 4 is a schematic diagram of an example implementation of the compensation circuitry of FIG. 2 including additional example compensation circuitry to support low carrier signal swing and a bipolar carrier signal.

FIG. 4 is a schematic diagram of an example compensation circuit including additional example compensation circuitry to support low carrier signal swing. Example bias circuit 204, example current mirror circuit 212, example rectification circuit 206, example output stage 208, and example compensation circuit 210A make up the envelope detector with temperature and process tracking.

In the example of FIG. 4, the compensation circuit 210A includes the first resistor ladder 324, the fourth transistor 326, the first transistor array 328, a second example resistor ladder 404, an example current source 408, and a second example transistor array 412. The second resistor ladder 404 is a resistor circuit configured to represent the carrier signal swing of the OOK modulated carrier signal in a plurality of divisions that combine to generate a linear or sinusoidal representation. For example, the second resistor ladder 404 may be implemented by a plurality of coupled resistors. The second transistor array 412 includes a plurality of transistor gate terminals each coupled to the second resistor ladder 404, such that each transistor gate terminal corresponds to a voltage division of the linear or sinusoidal representation of the low carrier signal swing (the portion of the OOK modulated carrier signal that is near approximately the threshold voltage of the rectification circuit 206 transistors) of the OOK modulated carrier signal. The second transistor array 412 may include N-channel MOSFETs, such that each drain terminal is coupled to the remaining drain terminals and each source terminal is coupled to common potential. Alternatively, the devices of the second transistor array 412 may be implemented by N number of N-channel FET, N-channel IGBT, N-channel JFET, NPN BJT, P-channel MOSFET, P-channel FET, P-channel IGBT, P-channel JFET, and/or PNP BJT.

An input of the first resistor ladder 324 is coupled to the adjustment current source 222 (also coupled, at another terminal, to voltage source VDD). The second resistor ladder 404 is coupled between the output of the bias current source 222 and the input of the current source 408. The first output of the second resistor ladder 404 is coupled to the input of the current source 408. The output of the current source 408 is coupled to a common potential (e.g. ground). The sources of the transistors included in the first transistor array 326 and the second transistor array 412 are coupled to a common potential (e.g. ground).

In example operation, the first output of the first resistor ladder 324 is based on the first adjustment current source 224. The first resistor ladder 324 may be configured to couple the tap terminals to the gate terminals of the first transistor array 328. The tap terminals of the first resistor ladder 324 couple to the corresponding gate terminals of the first transistor array 328 based on a linear compensation configuration or a sinusoidal compensation configuration. The linear compensation configuration couples the transistors of the first transistor array 328 to the divisions of the first resistor ladder 324 that combine to generate a linear compensation current. The sinusoidal compensation configuration couples the transistors of the first transistor array 328 to the divisions of the first resistor ladder 324 that combine to generate a sinusoidal compensation current. The second resistor ladder 404 may be configured to couple the tap terminals to the gate terminals of the second transistor array 412. The tap terminals of the second resistor ladder 404 couple to the corresponding gate terminals of the second transistor array 412 based on a linear compensation configuration or a sinusoidal compensation configuration. The linear compensation configuration couples the transistors of the second transistor array 412 to the divisions of the second resistor ladder 404 that combine to generate a linear compensation current. The sinusoidal compensation configuration couples the transistors of the second transistor array 412 to the divisions of the second resistor ladder 404 that combine to generate a sinusoidal compensation current. The receive duty cycle distortion correction circuit 154 of FIG. 1 may determine either of the compensation configurations and may configure the current source 408. The fourth transistor 326 generates a bias for the first resistor ladder 324 based on the second output of the first resistor ladder 324, the second bias current source 222, and the current source 408.

In example operation, the first output of the second resistor ladder 404 is based on the second output of the first resistor ladder 324 and the current source 222. The first output of the second resistor ladder 404 is based on the current being sunk to ground potential by the current source 408 and the current supplied by the adjustment current source 224. The current source 408 sinks current from the second resistor ladder 404 to enable the second transistor array 412, such that it contributes the current caused by temperature variation of transistors enabled by small swings in the carrier signal. The second resistor ladder 404 generates a current through the second transistor array 412 representing weakly enabled transistors (e.g. transistors enabled at approximately the threshold voltage) in the rectification circuit 206. Advantageously, the current source 408 using an output of the second resistor ladder 404 as a source, enables the current through the second transistor array 412 to compensate for the temperature variation of the portion of the carrier wave that weakly enables the rectification circuit 206.

Figure 5:
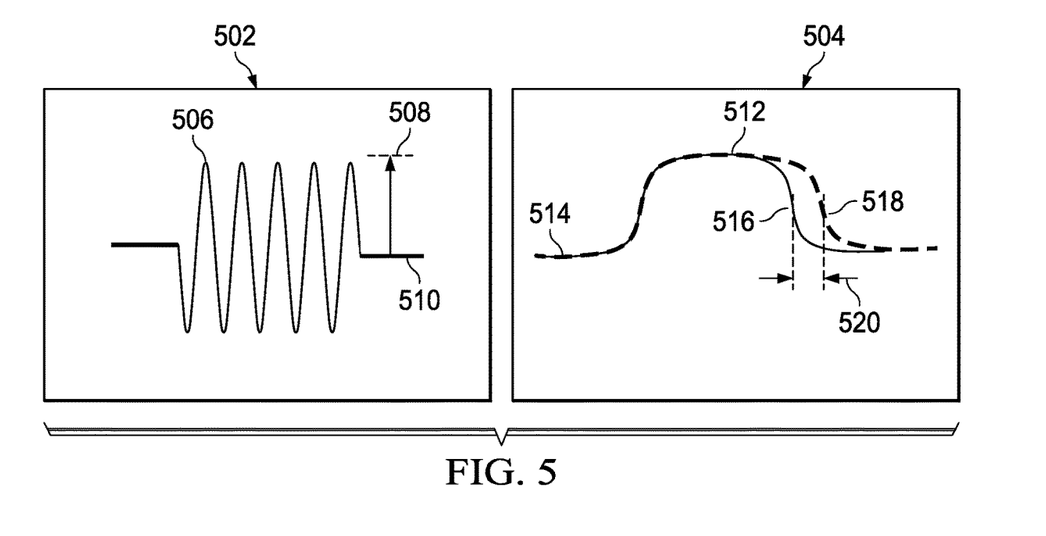
FIG. 5 is an example signal diagram including a signal in carrier form, as well as a corresponding digital signal.

FIG. 5 is an example timing diagram corresponding to the OOK modulated carrier signal input 214 (Rf_inp) of FIG. 2 and the example digital output signal 218 of FIG. 2. The graphs in FIG. 5 show time on the horizontal axis and voltage on the vertical axis. An example carrier waveform 502 is a OOK modulated carrier signal representation of a square wave signal (shown as waveform 516). Waveform 518 illustrates a demodulated version of the carrier waveform 502. In the example of FIG. 5, the carrier waveform 502 includes an example sinusoidal portion 506 (representing a modulated logic "1") having an amplitude 508. Carrier waveform 502 also includes an example low portion 510 (representing a modulated logic "0"). The carrier waveform 502 may correspond a frequency representation of a digital signal received at the end of an isolation barrier 101 of FIG. 1. In the example of FIG. 5, the digital waveform 504 includes waveforms 516 and 518. Each of these waveforms has a digital low 514 (representing a logic "0") and a digital high 512 (representing a logic "1"). Duty cycle distortion between the pre-modulated data waveform 516 and the demodulated carrier signal waveform 518 is illustrated as range 520.

In the example timing diagram FIG. 5, the carrier waveform 502 may exhibit a sinusoidal waveform with the amplitude 508 to represent logic level at a first voltage level (such as a logic high voltage indicative of a logic '1'). The frequency of the carrier waveform 502 represents the carrier frequency used to modulate the digital data. The combined trend of amplitudes of the carrier waveform 502 represents the modulated digital data. The vertical portion of the carrier waveform 502 between the high peak at amplitude 508 and the low peak 510 represent the portion of the carrier waveform 502 that the rectification circuit 206 of FIG. 3 may enable the second transistor 308 of FIG. 3. The vertical portion of the carrier waveform 502 below the low peak 510 represent the portion of the carrier waveform that the rectification circuit 206 of FIG. 3 may enable the third transistor 310 of FIG. 3. The second transistor 308 and third transistor 310 of FIG. 3 generate a full wave rectification of the carrier waveform 502. The full wave rectification of the carrier waveform 502 represents a logic level at a first voltage level (such as a logic high indicative of a logic '1') when between low peak 510 and the high peak of amplitude 508. The carrier waveform 502 may exhibit a steady state waveform at approximately the low peak 510 to represent a logic level at a second voltage level (such as a logic low voltage indicative of a logic '0'). The full wave rectification of the carrier waveform 502 will remain at the second voltage level as a result of the portion of the carrier waveform at approximately the low peak 510 not enabling the rectification circuit 206 of FIG. 3.

In the example timing diagram, the digital waveform 504 includes a digital high 512 that has a first voltage level to represent a logic value (such as a logic '1'). Conversely, a lower digital low 514 voltage level may be indicative of a different logic value (such as a logic "0"). The digital high 512 may be configured to have a set duration (e.g. a set duty cycle) such that discrete sampling of the digital waveform 504 may be used. The modulation/demodulation process between the carrier waveform 502 and the digital waveform 504 may lead the duty cycle of the pulse to vary between the minimum duty cycle at the waveform 516 and the maximum duty cycle at the waveform 518. Hence, the duty cycle of the demodulated carrier waveform 502 may be elongated in time due to duty cycle distortion in the range 520. The digital waveform 504 may have a steady state at the digital low 514 to represent logic level at a second voltage level (such as a logic low voltage indicative of a logic '0').

Figure 6:
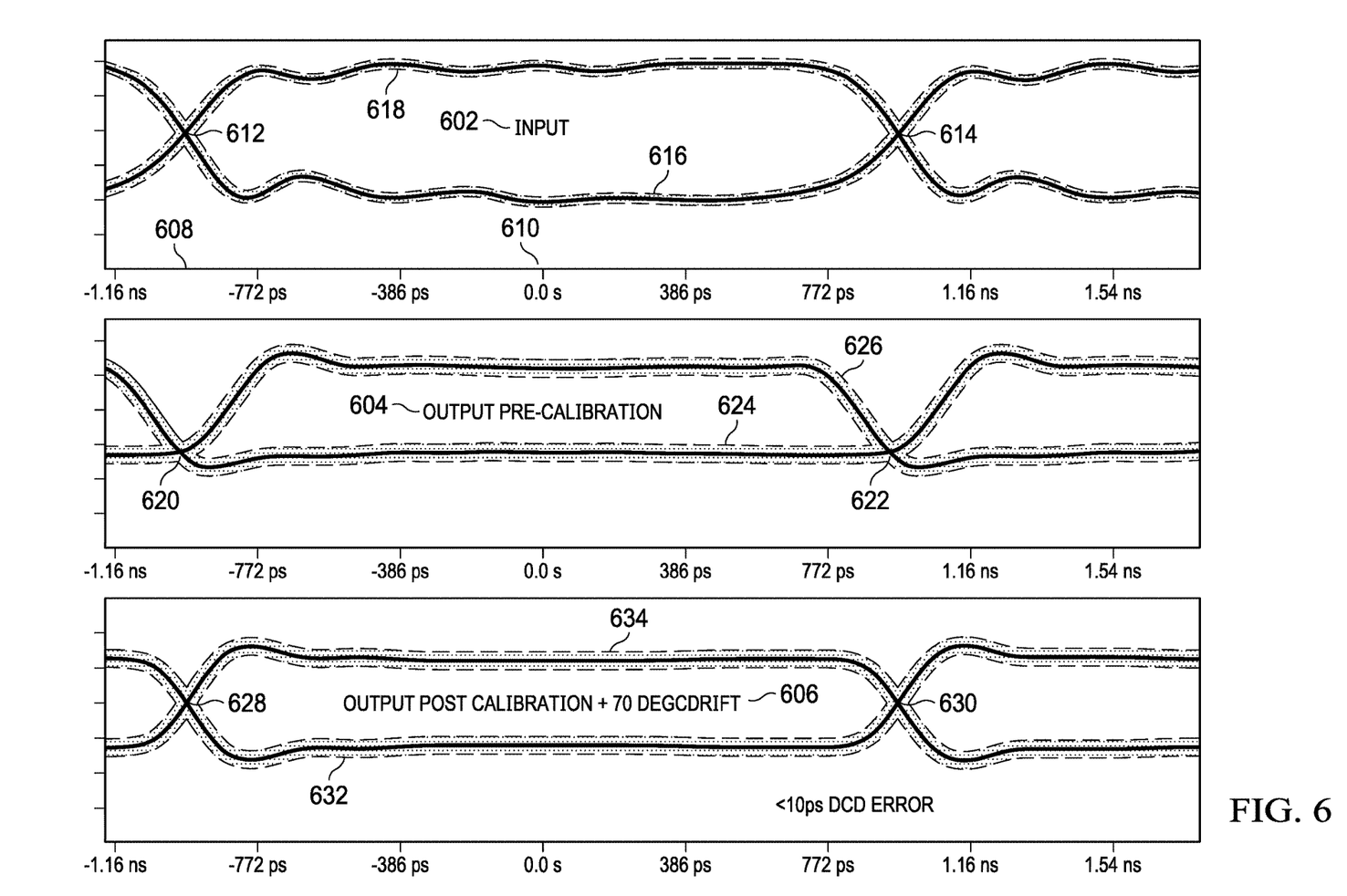
FIG. 6 includes example timing diagrams to illustrate signals through the example OOK envelope detector of FIG. 3 during an example operation.

FIG. 6 is an example timing diagram to illustrate signals through the example envelope detector 144 of FIG. 1 during an example operation. An example input signal 602, an example pre calibration output signal 604, and an example post calibration output signal 606 are the three signals illustrated in FIG. 6. The graphs in FIG. 6 show time on the horizontal axis 608 and voltage on the vertical axis 610. In the example of FIG. 6, the timing diagram for the input signal 602 includes an example first node 612, a second example node 614, a first example digital low 616, and a first example digital high 618. In the example of FIG. 6, the timing diagram for the pre calibration output signal 604 includes a third example node 620, a fourth example node 622, a second example digital low 624, and a second example digital high 626. In the example of FIG. 6, the timing diagram for the post calibration output signal 606 includes a fifth example node 628, a sixth example node 630, a third example digital low 632, and a third example digital high 634.

In the example timing diagram, the input signal 602 is the data input to the multiplexer 112 of FIG. 1. The input signal 602 is represented by a differential signal with the first node 612 near the average of the first digital high 618 and the first digital low 616. The second node 614 is near the average of the first digital high 618 and the first digital low 616. The first digital low 616 exhibits variation (such as jitter) causing the signal to have local peaks and valleys. The first digital high 618 exhibits variation (such as jitter) causing the signal to have local peaks and valleys.

In the example timing diagram, the pre calibration output signal 604 is the output of the single ended to differential converter 148 of FIG. 1 with the receive duty cycle distortion correction circuit 154 of FIG. 1 disabled, and the compensation circuit 210 of FIG. 2 not calibrated. The second digital low 624 represents the second output of the single ended to differential converter 148 of FIG. 1. The second digital high 626 represents the first output of the single ended to differential converter 148 of FIG. 1. The third node 620 is below the average of the second digital high 626 and the second digital low 624. The fourth node 622 is below the average of the second digital high 626 and the second digital low 624 representing a drift in the duty cycle causing duty cycle distortion of the pre calibration output signal 604 compared to the input signal 602 duty cycle. The second digital low 624 exhibits less variation (such as jitter) compared to the first digital low 616 of the input signal 602. The second digital high 626 exhibits less variation (such as jitter) compared to the first digital low 616 of the input signal 602. Advantageously, the pre calibration output signal 604 exhibited minimized jitter compared to the input signal 602.

In the example timing diagram, the post calibration output signal 606 is the output of the single ended to differential converter 148 of FIG. 1 with the receive duty cycle distortion correction circuit 154 of FIG. 1 enabled, the compensation circuit 210 of FIG. 3 calibrated, and the digital isolator circuit 100 of FIG. 1 at seventy degrees Celsius. The third digital low 632 represents the second output of the single ended to differential converter 148 of FIG. 1. The third digital high 634 represents the first output of the single ended to differential converter 148 of FIG. 1. The fifth node 628 is near the average of the third digital high 634 and the third digital low 632. The fifth node 630 is near the average of the third digital high 634 and the third digital low 632 representing a minimized drift in the duty cycle causing duty cycle distortion of the post calibration output signal 606 compared to the input signal 602 duty cycle. The third digital low 632 exhibits less variation (such as jitter) compared to the first digital low 616 of the input signal 602. The second digital high 626 exhibits less variation (such as jitter) compared to the first digital low 616 of the input signal 602. Advantageously, enabling the receive duty cycle distortion correction circuit 154 of FIG. 1 minimizes the difference between the duty cycle of the output signal and the input signal 602.

Figure 7:
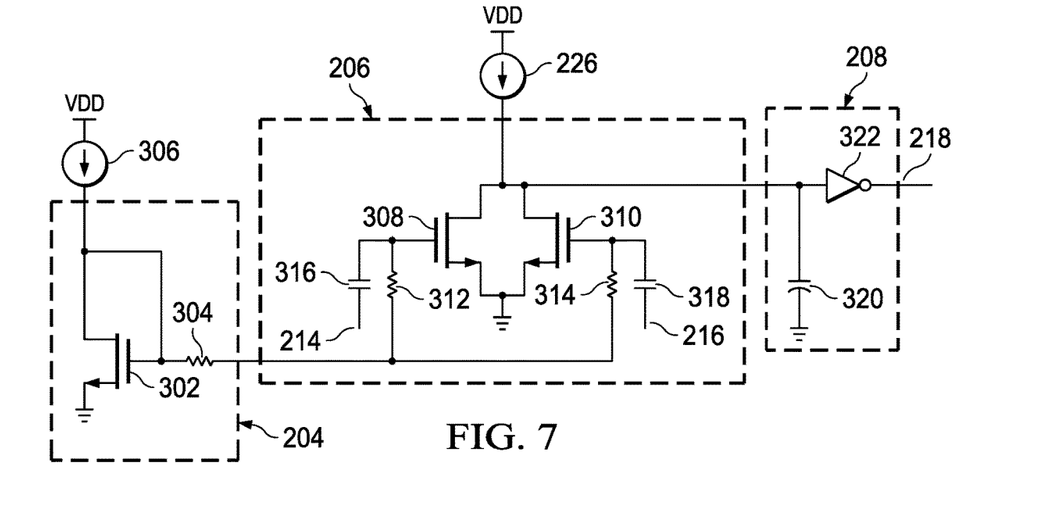
FIG. 7 is a schematic diagram of an OOK envelope detector circuit.

FIG. 7 is an example schematic diagram of an example on-off keying envelope detector. In the example of FIG. 7, the on-off keying envelope detector includes an example bias circuit 204, example rectification circuit 206, and example output stage 208. In the example of FIG. 7, the rectification circuit 206 is coupled to a current source 226.

In example operation, the rectification circuit 206 generates a full wave rectification of the OOK modulated carrier signal 214. The seventh capacitor 320 may discharge as a result of temperature variations in the full wave rectification of the OOK modulated carrier signal 214. The digital signal output 218 exhibits duty cycle distortion as a result of the discharge of the seventh capacitor 320. Unlike FIG. 3 and FIG. 4, the example conventional on-off keying envelope detector does not include any additional circuitry to compensate for the temperature variation in the rectification circuit 206 resulting in increased discharge from the seventh capacitor 320.

Figure 8:
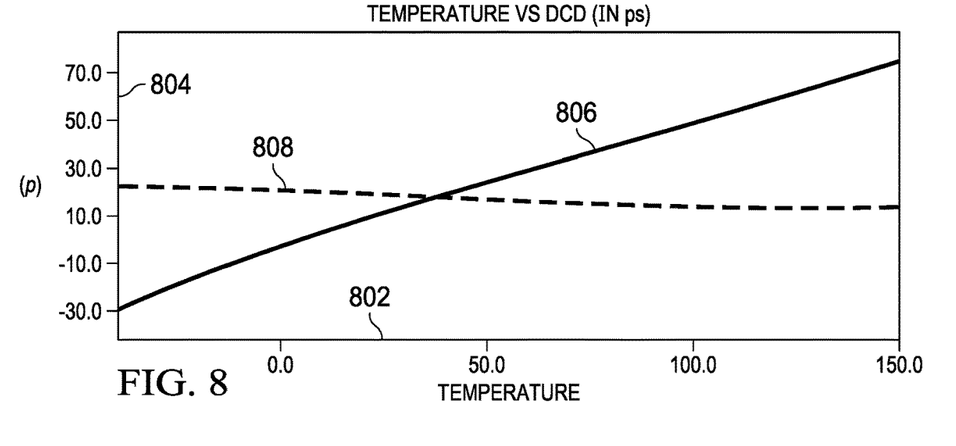
FIG. 8 is an example temperature versus duty cycle distortion (DCD) plot for the example OOK envelope detector of FIG. 7 and an example envelope detector with compensation circuitry of FIG. 3.

FIG. 8 is an example temperature versus duty cycle distortion (DCD) plot for the example OOK envelope detector of FIG. 7 and an example envelope detector with compensation circuitry of FIG. 3. The horizontal temperature axis 802 represents the temperature of the system in degrees Fahrenheit. The vertical duty cycle distortion axis 804 represents the time different between the duty cycle of the original digital pulse at the digital input of the multiplexer 112 of FIG. 1 and the duty cycle of the pulse created by a given envelope detector in picoseconds.

In FIG. 8, the solid line 806 represents the output of the OOK envelope detector FIG. 7 (if it was implemented by the digital isolator circuit 100 of FIG. 1 with the receive duty cycle distortion correction circuit 154 of FIG. 1 disabled). The solid line 806 exhibits a duty cycle distortion moving in a linear fashion from near −30 picoseconds at −40 degrees Fahrenheit to near 70 picoseconds at 150 degrees Fahrenheit. The linear trend exhibited by the solid line 806 includes decreased and increased duty cycle of the output digital pulse dependent on the temperature of the system.

The dashed line 808 represents output of the envelope detector (with temperature and process tracking of FIG. 4 implemented in the digital isolator circuit 100 of FIG. 1 with the receive duty cycle distortion correction circuit 154 of FIG. 1 enabled to adjust the compensation circuit 210A of FIG. 4). The dashed line 808 is roughly linear with a peak at a temperature lower than the temperature corresponding to the average duty cycle distortion, and a valley at a temperature higher than the temperature corresponding to the average duty cycle distortion. The peak of the dashed line 808 is near 25 picoseconds, and the valley is near 10 picoseconds.

Advantageously, the dashed line 808 exhibited a minimized range of duty cycle distortion across the temperature range compared to the solid line 806. The circuitry represented by the dashed line 808 may be configured for applications requiring more tolerance as a result of increasing data transmission speeds compared to the circuitry represented by the solid line 806.

Figure 9:
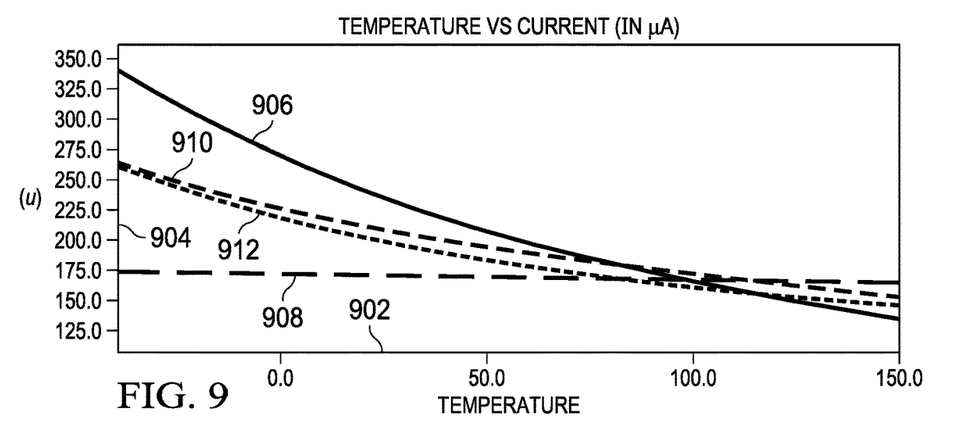
FIG. 9 is an example temperature versus current plot of the currents of the OOK envelope detector circuit of FIG. 7 and the example envelope detector circuit with compensation circuitry of FIG. 3.

FIG. 9 is an example temperature (horizontal axis—in ° F.) versus current (vertical axis—in µA) plot of the internal currents of the OOK envelope detector of FIG. 7 and the example envelope detector with compensation circuitry 144 of FIG. 3. In the example of FIG. 9, line 906 represents an OOK envelope detector output stage capacitor discharging current; plot 908 represents an OOK envelope detector charging current; plot 910 represents an envelope detector with temperature and process tracking discharging current and plot 912 represents an envelope detector with temperature and process tracking charging current.

In the example temperature versus duty cycle distortion plot, line 906 represents the discharging current of the digital output signal of the OOK envelope detector of FIG. 7 (implemented in the digital isolator circuit 100 of FIG. 1 with the receive duty cycle distortion correction circuit 154 of FIG. 1 disabled). Line 906 exhibits a trend for a current decreasing from near 350 microamps at −40 degrees Fahrenheit to near 125 microamps at 150 degrees Fahrenheit. Line 908 represents the charging current of the digital output signal of the OOK envelope detector of FIG. 7 (implemented in the digital isolator circuit 100 of FIG. 1 with the receive duty cycle distortion correction circuit 154 of FIG. 1 disabled). Line 908 exhibits a near linear trend near 175 microamps at approximately −40 degrees Fahrenheit to near 160 microamps at approximately 150 degrees Fahrenheit.

Line 910 represents the discharging current of the digital output signal of the envelope detector with compensation circuitry of FIG. 4 (implemented in the digital isolator circuit 100 of FIG. 1 with the receive duty cycle distortion correction circuit 154 of FIG. 1 enabled). Line 910 exhibits a trend for a current decreasing from near 265 microamps at approximately −40 degrees Fahrenheit to near 150 microamps at 150 degrees Fahrenheit. Line 912 represents the charging current of the digital output signal of the envelope detector with compensation circuitry of FIG. 4 (implemented in the digital isolator circuit 100 of FIG. 1 with the receive duty cycle distortion correction circuit 154 of FIG. 1 enabled). Line 912 exhibits a trend for a current decreasing from near 265 microamps at −40 degrees Fahrenheit to near 150 microamps at approximately 150 degrees Fahrenheit.

Advantageously, the difference between the line 910 and line 912 is much less than the difference between line 906 and line 908. The minimized difference between the charging and discharging current for the envelope detector with compensation circuitry FIG. 4 represents better tracking of both the charging and discharging currents by the envelope detector with compensation circuitry 144 of FIG. 3.

Various forms of the term "couple" are used throughout the specification. These terms may cover connections, communications, or signal paths that enable a functional relationship consistent with the description of the present disclosure. For example, if device A generates a signal to control device B to perform an action, in a first example device, A is coupled to device B by direct connection, or in a second example device, A is coupled to device B through intervening component C if intervening component C does not alter the functional relationship between device A and device B such that device B is controlled by device A via the control signal generated by device A.

Consistent with the present disclosure, the term "configured to" describes the structural and functional characteristics of one or more tangible non-transitory components. For example, a device that is "configured to" perform a function mean that the device has a particular configuration that is designed or dedicated for performing a certain function. A device is "configured to" perform a certain function if such a device includes tangible non-transitory components that can be enabled, activated, or powered to perform that certain function. While the term "configured to" may encompass being configurable, this term is not limited to such a narrow definition. Thus, when used for describing a device, the term "configured to" does not require the described device to be configurable at any given point of time.

Moreover, the term "example" is used herein to mean serving as an instance, illustration, etc., and not necessarily as advantageous. Also, although the disclosure has been shown and described with respect to one or more implementations, equivalent alterations and modifications will be apparent upon a reading and understanding of this specification and the annexed drawings. All such modifications and alterations are fully supported by the disclosure and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in an example particular order, this does not require that such operations be performed in the example particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above does not require such separation in all embodiments.

Descriptors "first," "second," "third," etc. are used herein when identifying multiple elements or components which may be referred to separately. Unless otherwise specified or understood based on their context of use, such descriptors do not impute any meaning of priority, physical order, or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead. For example, a p-type metal-oxide-silicon FET ("MOSFET") may be used in place of an n-type MOSFET with little or no changes to the circuit. Furthermore, other types of transistors may be used (such as bipolar junction transistors (BJTs)).

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

The following claims are hereby incorporated into this Detailed Description by this reference, with each claim standing on its own as a separate embodiment of the present disclosure.

What is claimed is:

1. An apparatus comprising:
   a compensation circuit including:
      a current compensation output;
      a first transistor with a first current terminal and a first control terminal, the first current terminal coupled to the current compensation output; and
      a resistor ladder with a tap terminal coupled to the first control terminal;
   a current mirror circuit having a mirror input and a mirror output, the mirror input coupled to the current compensation output; and
   a rectification circuit having an input coupled to the mirror output.

2. The apparatus of claim 1, wherein the compensation circuit includes a bias circuit coupled to the first control terminal through the resistor ladder, and a plurality of transistors include the first transistor.

3. The apparatus of claim 2, wherein the resistor ladder includes a plurality of resistor branches and a plurality of tap terminals, and each transistor of the plurality of transistors includes a control terminal coupled to a tap terminal.

4. The apparatus of claim 1, wherein the resistor ladder is configurable to a linear compensation configuration or a sinusoidal compensation configuration, the sinusoidal compensation configuration enables the tap terminals that generate a sinusoidal compensation signal.

5. The apparatus of claim 1, wherein the compensation circuit further including:
   the resistor ladder being a first resistor ladder and a second resistor ladder; and
   a second transistor including a second control terminal and a second current terminal, the second control terminal coupled to a bias circuit through the second resistor ladder, the second current terminal coupled to the current compensation output.

6. The apparatus of claim 1, wherein the compensation circuit further coupled to an adjustment current source and a bias current source, and a current from the adjustment current source is based on an on-off keying modulated carrier signal received by the rectification circuit.

7. The apparatus of claim 1, wherein rectification circuit includes a primary transistor and a secondary transistor, the primary and the secondary transistors configured to receive the on-off keying modulated carrier signal and a current from the mirror output.

8. The apparatus of claim 7, wherein the current from the mirror output is a scaled version of an average sum of currents flowing through the primary transistor and the secondary transistor.

9. The apparatus of claim 1, wherein the rectification circuit is coupled to an output stage including an input and an output, the input coupled to the rectification circuit and the mirror output, and the output configured to generate a digital signal output.

* * * * *